United States Patent
Takabayashi et al.

(10) Patent No.: US 11,348,850 B2
(45) Date of Patent: May 31, 2022

(54) VEHICLE POWER CONVERSION DEVICE

(71) Applicant: Mitsubishi Electric Corporation, Tokyo (JP)

(72) Inventors: Hirokazu Takabayashi, Tokyo (JP); Ryosuke Nakagawa, Tokyo (JP); Shigetoshi Ipposhi, Tokyo (JP); Masaru Shinozaki, Tokyo (JP); Hiroyuki Ushifusa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 181 days.

(21) Appl. No.: 16/496,645

(22) PCT Filed: Mar. 27, 2017

(86) PCT No.: PCT/JP2017/012290
§ 371 (c)(1),
(2) Date: Sep. 23, 2019

(87) PCT Pub. No.: WO2018/179031
PCT Pub. Date: Oct. 4, 2018

(65) Prior Publication Data
US 2020/0381317 A1    Dec. 3, 2020

(51) Int. Cl.
*H01L 23/04*    (2006.01)
*H01L 23/049*    (2006.01)
(Continued)

(52) U.S. Cl.
CPC ............. *H01L 23/049* (2013.01); *F28F 3/02* (2013.01); *F28F 3/04* (2013.01); *F28F 3/06* (2013.01);
(Continued)

(58) Field of Classification Search
CPC ... H01L 23/049; H01L 23/373; H01L 23/367; H01L 23/473; H01L 23/42; F28F 3/02; F28F 3/04; F28F 3/06; H02M 7/003
See application file for complete search history.

(56) References Cited

U.S. PATENT DOCUMENTS

2003/0066634 A1    4/2003  Valenzuela et al.
2007/0227707 A1*  10/2007  Machiroutu .......... H01L 23/427
                                                            165/121
(Continued)

FOREIGN PATENT DOCUMENTS

EP    2469996 A2    6/2012
JP    S61115767 A   6/1986
(Continued)

OTHER PUBLICATIONS

Office Action (Notification of Reasons for Rejection) dated Oct. 1, 2019, by the Japan Patent Office in corresponding Japanese Patent Application No. 2019-508332 and English translation of the Office Action. (9 pages).

(Continued)

*Primary Examiner* — Charles D Garber
*Assistant Examiner* — S M Sohel Imtiaz
(74) *Attorney, Agent, or Firm* — Buchanan Ingersoll & Rooney PC

(57) ABSTRACT

A vehicle power conversion device includes: a housing configured to accommodate an electronic component therein and having an opening; and a cooling device. The cooling device includes a base being a plate-shaped member and heat sinks attached to the base. The base has a groove with refrigerant enclosed. The base has a first main surface to which the electronic component is to be attached, and covers the opening by the first main surface facing an interior of the (Continued)

housing. The heat sinks are joined, at intervals, onto the second main surface of the base.

13 Claims, 11 Drawing Sheets

(51) Int. Cl.
| | |
|---|---|
| *F28F 3/02* | (2006.01) |
| *H02M 7/00* | (2006.01) |
| *F28F 3/04* | (2006.01) |
| *F28F 3/06* | (2006.01) |
| *H01L 23/42* | (2006.01) |
| *H01L 23/473* | (2006.01) |
| *H01L 23/367* | (2006.01) |
| *H01L 23/373* | (2006.01) |

(52) U.S. Cl.
CPC .......... *H01L 23/367* (2013.01); *H01L 23/373* (2013.01); *H01L 23/42* (2013.01); *H01L 23/473* (2013.01); *H02M 7/003* (2013.01)

(56) References Cited

U.S. PATENT DOCUMENTS

| | | | | |
|---|---|---|---|---|
| 2012/0227952 | A1* | 9/2012 | Yoshihara | H01L 23/3672 |
| | | | | 165/185 |
| 2012/0261093 | A1 | 10/2012 | Miyachi et al. | |
| 2013/0048253 | A1* | 2/2013 | Yang | H01L 23/3731 |
| | | | | 165/104.26 |
| 2013/0220587 | A1* | 8/2013 | Tamura | F28F 3/086 |
| | | | | 165/185 |
| 2014/0138075 | A1* | 5/2014 | Yang | H01L 23/473 |
| | | | | 165/185 |
| 2017/0063071 | A1 | 3/2017 | Yoneyama et al. | |
| 2017/0268828 | A1* | 9/2017 | Lin | F28D 15/02 |
| 2017/0309540 | A1* | 10/2017 | Temmei | H01L 25/07 |

FOREIGN PATENT DOCUMENTS

| | | | |
|---|---|---|---|
| JP | 2004-349673 A | | 12/2004 |
| JP | 2005505739 A | | 2/2005 |
| JP | 2009239043 A | | 10/2009 |
| JP | 2009239043 A | * | 10/2009 |
| JP | 2010-040987 A | | 2/2010 |
| JP | 4491209 B2 | | 6/2010 |
| JP | 2011125152 A | * | 6/2011 |
| JP | 2011125152 A | | 6/2011 |
| JP | 2012075251 A | | 4/2012 |
| JP | 2012075251 A | * | 4/2012 |
| JP | 2012157161 A | | 8/2012 |
| JP | 2012-220141 A | | 11/2012 |
| JP | 5560182 B2 | | 7/2014 |
| JP | 2014220965 A | | 11/2014 |
| JP | 2015-219639 A | | 12/2015 |
| JP | 2016220341 A | | 12/2016 |
| JP | 2017046529 A | | 3/2017 |

OTHER PUBLICATIONS

Office Action dated Feb. 25, 2020, issued in corresponding Japanese Patent Application No. 2019-508332, 8 pages including 4 pages of English translation.

International Search Report (PCT/ISA/210) and translation and Written Opinion (PCT/ISA/237) dated Apr. 18, 2017, by the Japanese Patent Office as the International Searching Authority for International Application No. PCT/JP2017/012290.

Office Action dated Dec. 14, 2020, issued in Indian Patent Application No. 201927039510, 7 pages.

* cited by examiner

VEHICLE POWER CONVERSION DEVICE

TECHNICAL FIELD

The present disclosure relates to a vehicle power conversion device with a cooling device.

BACKGROUND ART

Semiconductor elements included in a power conversion device generate heat during switching operation thereof. For dissipation of the heat generated by the semiconductor elements, the power conversion device is provided with a cooling device. Patent Literature 1 discloses heat sinks including heat pipes that are embedded and extend substantially over the entire length of a base plate. The heat pipes are first fitted in grooves for embedding formed in the base plate and then covered by soldering. Patent Literature 2 discloses a power conversion device disposed under a floor of a rail car. The power conversion device includes a power semiconductor module on one surface of a heat receiving member, and heat pipes embedded in the other surface of the heat receiving member. The heat pipes are thermally connected to the heat receiving member by soldering.

CITATION LIST

Patent Literature

Patent Literature 1: Japanese Patent No. 4491209
Patent Literature 2: Japanese Patent No. 5560182

SUMMARY OF INVENTION

Technical Problem

The heat sinks disclosed in Patent Literature 1 have increased heat resistance due to a solder between the base plate and the heat pipes. The power conversion device disclosed in Patent Literature 2 has increased heat resistance due to solder between the heat receiving member and the heat pipes. Such an increased heat resistance decreases cooling efficiency of the cooling device.

The present disclosure is made in consideration of such a situation, and an objective of the present disclosure is to improve cooling performance of a vehicle power conversion device.

Solution to Problem

In order to attain the aforementioned objective, a vehicle power conversion device according to the present disclosure includes: a housing configured to accommodate an electronic component therein and to be fixed to a vehicle and having an opening; a base being attached to the housing, and heat sinks. The base is a plate-shaped member having a first main surface and a second main surface opposite to each other. The base internally has a groove extending along the first main surface and the second main surface, and refrigerant is enclosed in the groove. The base covers the opening by the first main surface facing an interior of the housing. The electronic component is attached to the first main surface. The heat sinks are joined, at intervals, on the second main surface.

Advantageous Effects of Invention

According to the present disclosure, cooling performance of the vehicle power conversion device can be improved by providing the heat sinks, at intervals, on a surface of the base internally including the groove with refrigerant enclosed.

DESCRIPTION OF EMBODIMENTS

Example of the present disclosure will now be described in detail with reference to the drawings. Throughout the drawings, the same or similar components are denoted by the same reference signs.

Embodiment 1

Figure 1:
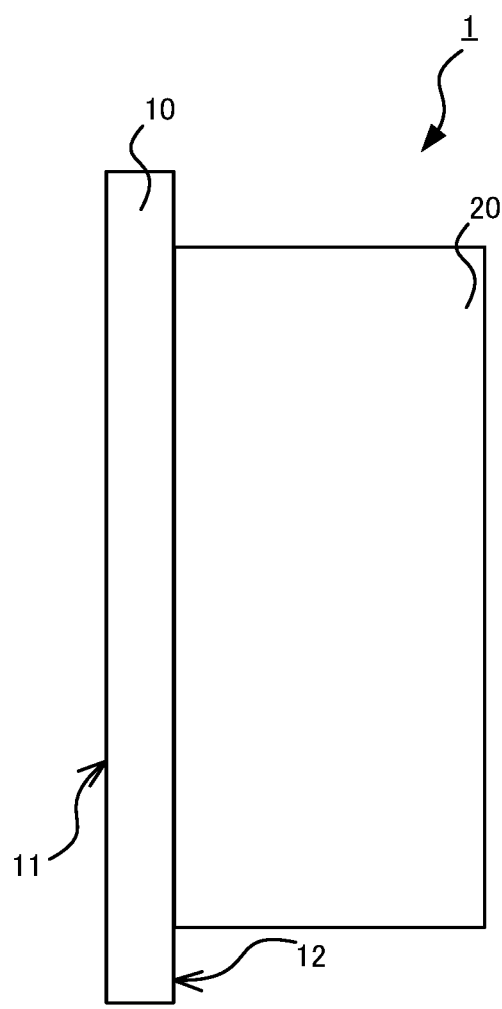
FIG. 1 is a side view of a cooling device according to Embodiment 1 of the present disclosure.

FIG. 1 is a side view of a cooling device according to Embodiment 1 of the present disclosure. A cooling device 1 is provided with a base 10 that is a plate-shaped member and heat sinks 20 attached to the base 10. The number of the heat sinks 20 may be freely selected. In the example of FIG. 1, the heat sinks 20 are fins. The base 10 has a first main surface 11 to which an electronic component is to be attached, and a second main surface 12 facing the first main surface 11. The heat sinks 20 are attached to the second main surface 12. The cooling device 1 cools the electronic component to be attached to the first main surface 11.

Figure 2:
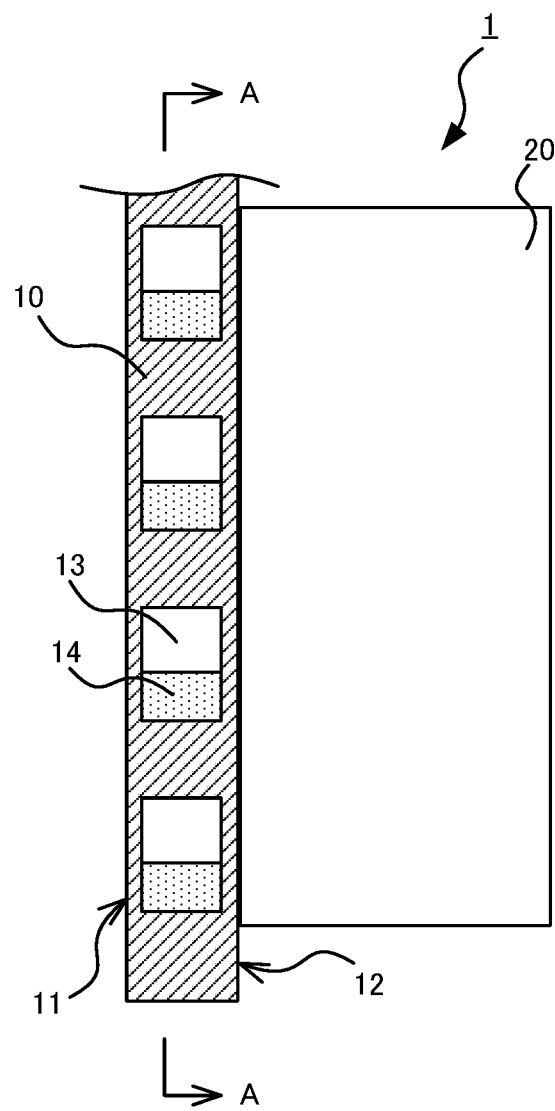
FIG. 2 is a cross-sectional view of a cooling device according to Embodiment 1.

FIG. 2 is a cross-sectional view of the cooling device according to Embodiment 1. A groove 13 extending along the first main surface 11 and the second main surface 12 is formed in the interior of the base 10. Refrigerant 14 is enclosed in the grooves 13. The refrigerant 14 is in a gas-liquid two phase state in which there exist both gaseous refrigerant 14 and liquid refrigerant 14. The refrigerant is, for example, pure water, ethanol, acetone, or the like.

Figure 3:
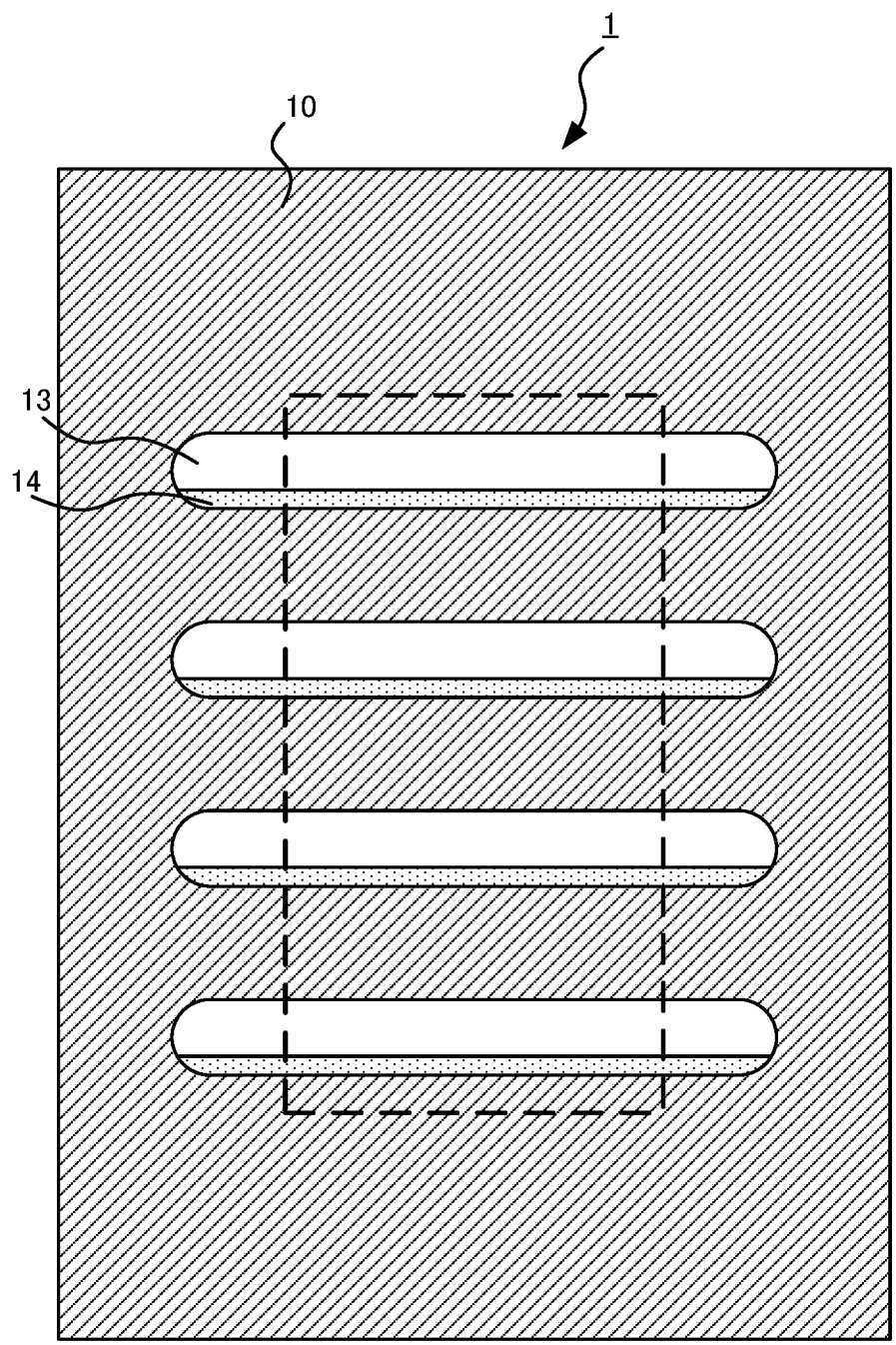
FIG. 3 is a cross-sectional view of the cooling device according to Embodiment 1.

FIG. 3 is a cross-sectional view of the cooling device according to Embodiment 1. FIG. 3 is a cross-sectional view taken along the line A-A in FIG. 2. In Embodiment 1, the grooves 13 each extending along the first main surface 11 and the second main surface 12 in a horizontal direction, are arranged in a vertical direction. In the example of Embodiment 1, although the heat sinks 20 are fins extending in the vertical direction, the heat sinks 20 may be attached in any direction. The heat sinks 20 may be fins extending in the horizontal direction. With the fins serving as the heat sinks 20 that extend in the same direction as the grooves 13, cooling performance of a vehicle power conversion device 2 can be improved. In addition, by aligning the direction in which the fins extend with the traveling direction of a vehicle, the headwind can be brought into contact with the heat sinks 20. Thus, cooling performance of the vehicle power conversion device 2 can be improved. In FIG. 3, a portion surrounded by a dashed line is a portion facing the portion of the first main surface 11 to which the electronic component as described below is attached. Specifically, the portion surrounded by dashed lines in FIG. 3 is where temperature rises due to the heat generated by the electronic component. Convection of the refrigerant 14 enclosed in each of the grooves 13 makes the temperature of the refrigerant 14 uniform in the horizontal direction, thereby achieving the horizontal directional equalization of the temperature of the below-described electronic component attached to the first main surface 11.

Figure 4:
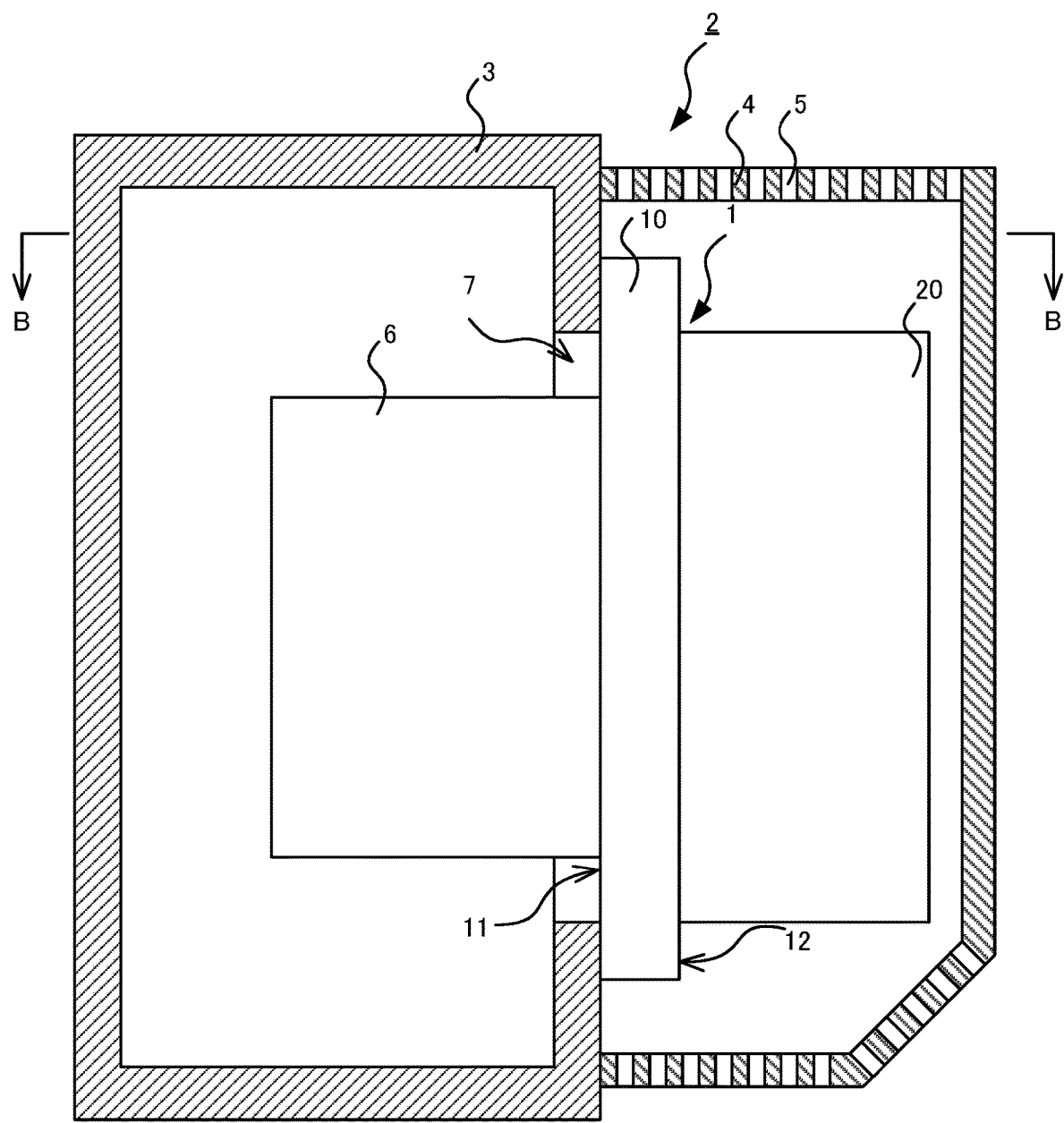
FIG. 4 is a cross-sectional view of a power conversion device according to Embodiment 1.
Figure 5:
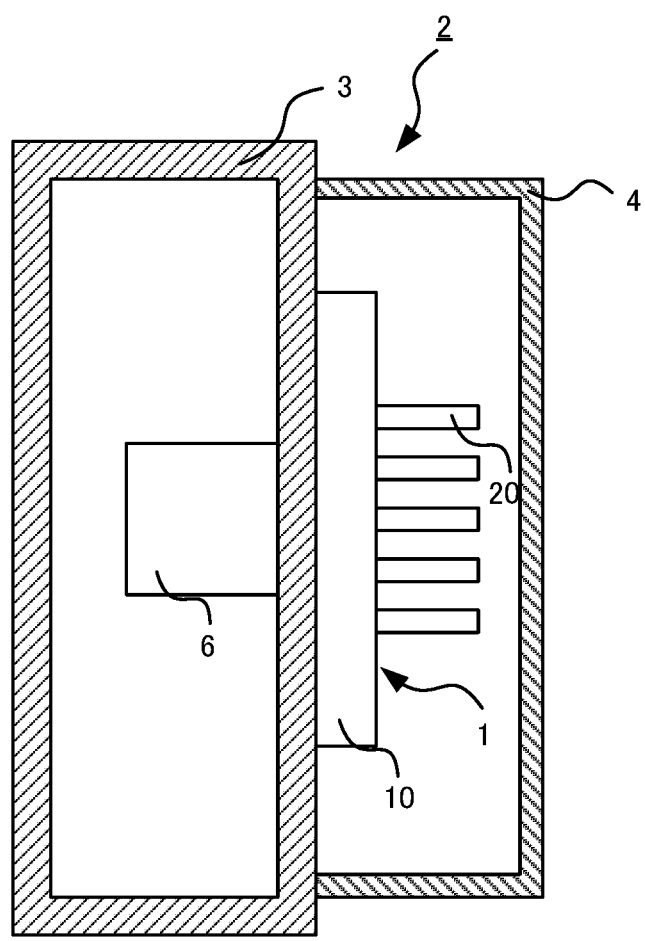
FIG. 5 is a cross-sectional view of the power conversion device according to Embodiment 1.
Figure 6:
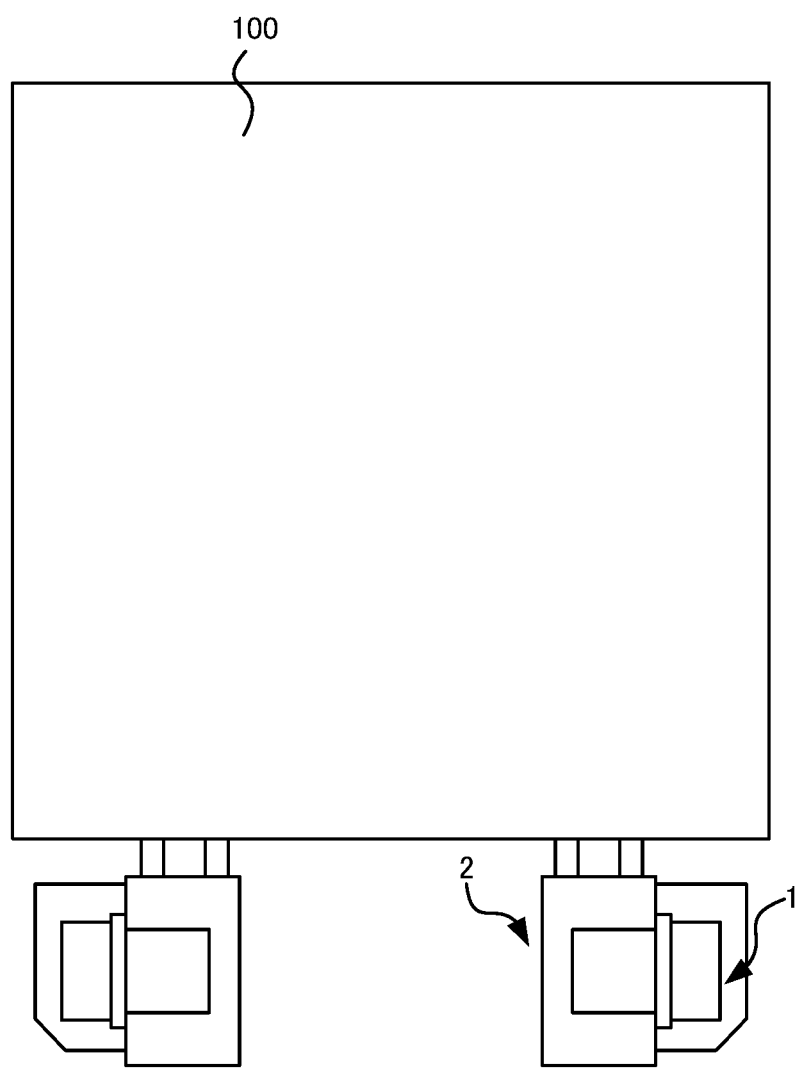
FIG. 6 is a drawing illustrating an example of installation of the power conversion device to a vehicle according to Embodiment 1.

FIG. 4 is a cross-sectional view of a power conversion device according to Embodiment 1. FIG. 5 is a cross-sectional view of the power conversion device according to Embodiment 1. FIG. 5 is a cross-sectional view taken along the line B-B in FIG. 4. FIG. 6 is a drawing illustrating an example of installation of the power conversion device to a vehicle according to Embodiment 1. The vehicle power conversion device 2 is provided with a housing 3 and the cooling device 1. The housing 3 accommodates an electronic component 6. The housing 3 has an opening 7. The housing 3 of the vehicle power conversion device 2 is to be disposed under a floor of a vehicle 100. The cooling device 1 is attached to the housing 3. The base 10 of the cooling device 1 covers the opening 7. The first main surface 11 of the base 10 faces the interior of the housing 3. The electronic component 6 is attached to the first main surface 11. Since the base 10 has the grooves 13, the thickness of the base 10 in the direction in which the first main surface 11 and the second main surface 12 are opposite to each other is greater than the thickness of the housing 3. In the example of FIG. 4, the cooling device 1 is covered with a cover 4. The cover 4 has vents 5. Air flowed in from the vents 5 flows while coming into contact with the heat sinks 20. Heat is transferred from the heat sinks 20 to air, thereby cooling the electronic component 6.

The process of cooling the electronic component 6 by the cooling device 1 is described. The heat generated by the electronic component 6 is transferred to the refrigerant 14 via the first main surface 11 of the base 10. The temperature of liquid refrigerant 14 rises due to the heat transferred from the electronic component 6, and thus, the refrigerant 14 changes to gas. The vaporized refrigerant 14 flows toward the portion having a lower temperature inside of the grooves 13. Heat is transferred from the refrigerant 14 to the heat sinks 20 via the second main surface 12 while the refrigerant 14 flows toward the portion having a lower temperature inside the grooves 13. The temperature of the refrigerant 14 lowers after transferring its heat to the heat sinks 20, and thus the refrigerant 14 changes to liquid. The heat sinks 20 receiving heat from the refrigerant 14 transfers heat to the air that flows while coming into contact with the heat sinks 20. The transfer of heat to the air cools the heat sinks 20. As described above, the heat generated by the electronic component 6 is transferred through the refrigerant 14 and the heat sinks 20 to the air, thereby cooling the electronic component 6.

Each inner surface of the grooves 13 has a structure such as a wick, groove, or mesh that generates a capillary action to promote the flow of the refrigerant 14. The material of the base 10 and heat sinks 20 is, for example, aluminum. The heat sinks 20 are joined on the second main surface 12 by, for example, soldering, friction stir welding, or the like. The base 10 can be obtained by curving the grooves 13 in one surface of one plate-shaped member, and pouring the refrigerant 14 into the grooves 13, followed by bonding another plate-shaped member on the plate-shaped member to seal the grooves 13. Alternatively, the base 10 can be obtained by gouging the grooves 13 into a lateral surface of a plate-shaped member having the first main surface 11 and the second main surface 12, and pouring the refrigerant 14 into the grooves 13, followed by sealing the lateral surface.

In Embodiment 1, heat is transferred from the electronic component 6 to the refrigerant 14 through the first main surface 11 of the base 10, and is further transferred from the refrigerant 14 to the heat sinks 20 through the second main surface 12. The thermal resistance between the electronic component 6 and the refrigerant 14, and the thermal resistance between the refrigerant 14 and the heat sinks 20 are lower as compared with a heat pipe cooler in which a pipe is soldered onto a base plate. Accordingly, the cooling device 1 according to Embodiment 1 has a cooling capability higher than that of this heat pipe cooler.

The electronic component 6 is a power conversion device such as an inverter. The electronic component 6 includes an electronic element made of, for example, a wide bandgap semiconductor having a bandgap wider than silicon and an example of the electronic element is a switching element and, a diode, or the like. The wide bandgap semiconductor is, for example, silicon carbide, gallium nitride-based material, diamond, or the like. When the switching element made of the wide bandgap semiconductor is used, switching speed increases, thereby causing an increase in an amount of heat generated by the electronic component 6. The electronic component 6 including the electronic element made of the wide band gap semiconductor can be sufficiently cooled by providing the cooling device 1 according to Embodiment 1.

As described above, according to the vehicle power conversion device 2 according to Embodiment 1 of the present disclosure, cooling performance of the vehicle power conversion device 2 can be improved by jointing the heat sinks 20, at intervals, onto the second main surface 12 of the base 10 that integrally has the grooves 13 with refrigerant 14 enclosed. Furthermore, the base 10 including, inside thereof, the grooves 13 that extend in the horizontal direction can make the temperature of the electronic component 6 uniform in the horizontal direction. With the fins serving as the heat sinks 20 extending in the same extending direction as the grooves 13, cooling performance of the vehicle power conversion device 2 can be improved. The base 10 includes, inside thereof, the grooves 13 extending in the horizontal direction. The vehicle power conversion device 2 according to Embodiment 1 is suitable for a cooling method in which a temperature may vary in the horizontal direction, such as a cooling method using headwind that flows in the horizontal direction.

Embodiment 2

Figure 7:
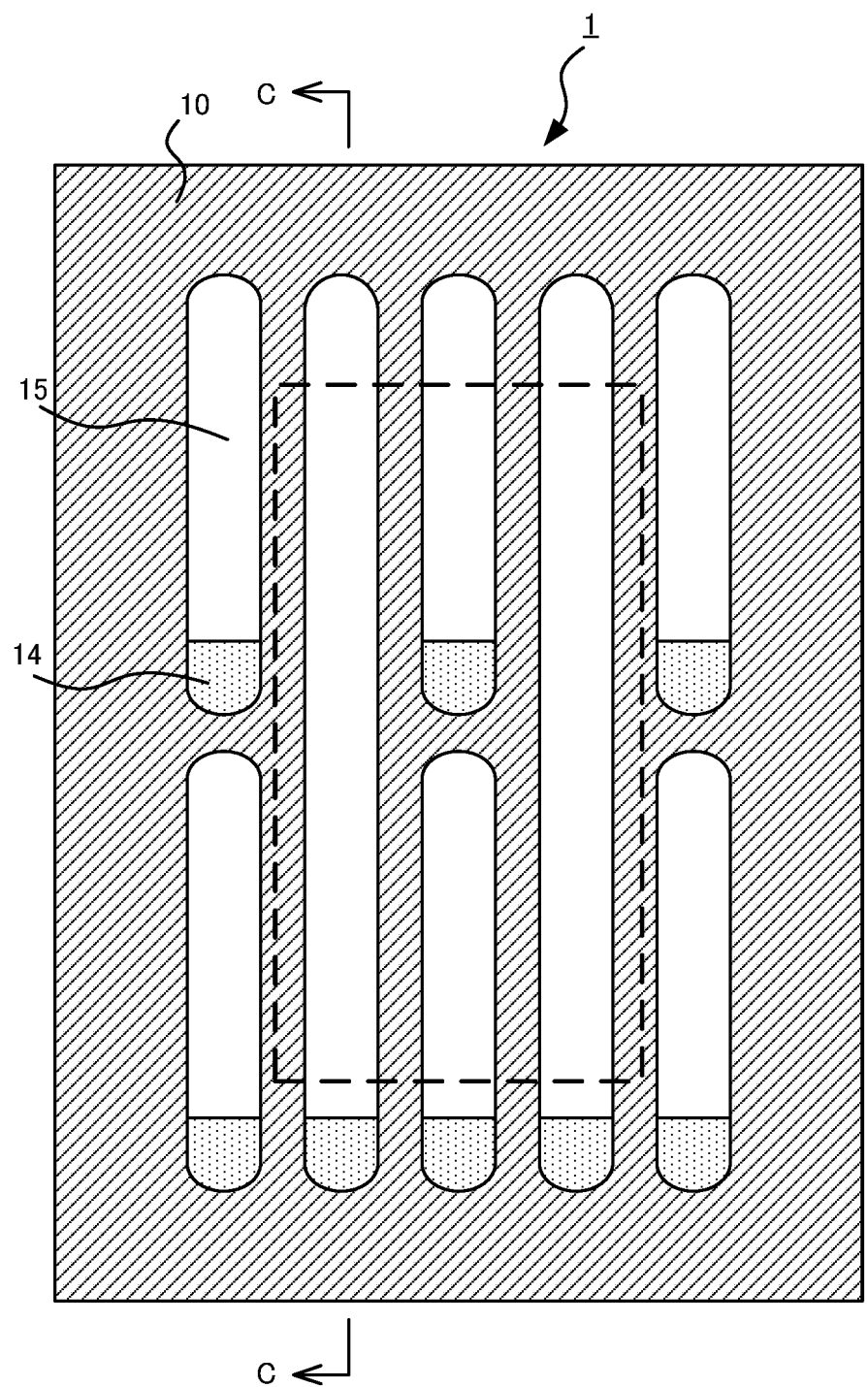
FIG. 7 is a cross-sectional view of a cooling device according to Embodiment 2 of the present disclosure.
Figure 8:
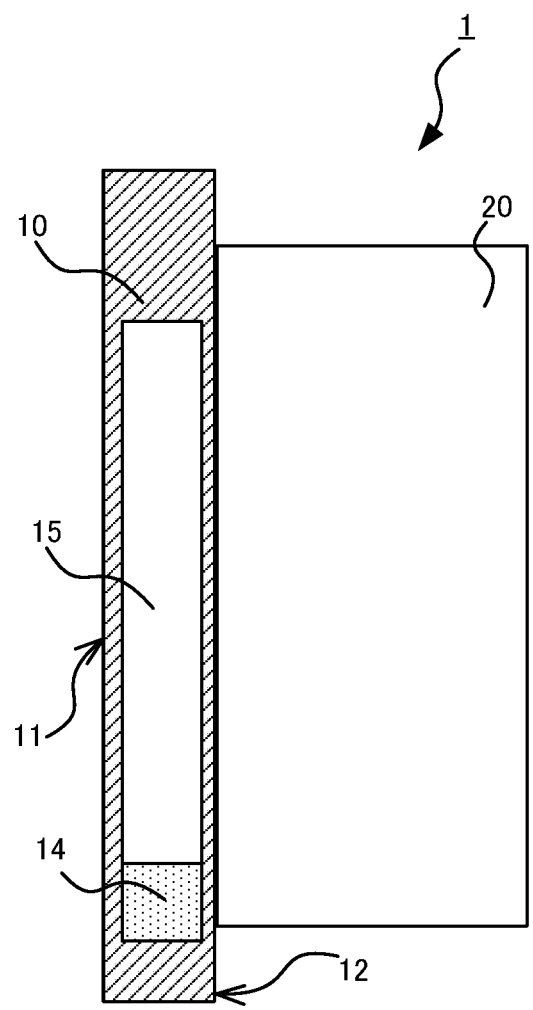
FIG. 8 is a cross-sectional view of the cooling device according to Embodiment 2.

FIG. 7 is a cross-sectional view of a cooling device according to Embodiment 2 of the present disclosure. FIG. 8 is a cross-sectional view of the cooling device according to Embodiment 2. FIG. 8 is a cross-sectional view taken along the line C-C in FIG. 7. Unlike Embodiment 1, the base 10 of the cooling device 1 according to Embodiment 2 has grooves 15 that each extend in the vertical direction and are arranged in the horizontal direction. As in Embodiment 1, the heat sinks 20 are joined to the second main surface 12.

As in Embodiment 1, the cooling device 1 cools the electronic component 6. In the example of FIG. 7, the vaporized refrigerant 14 flows toward the portion having a lower temperature inside the grooves 15. Movement of the refrigerant 14 in the vertical direction makes the temperature of the electronic component 6 attached to the first main surface 11 uniform in the vertical direction.

Figure 9:
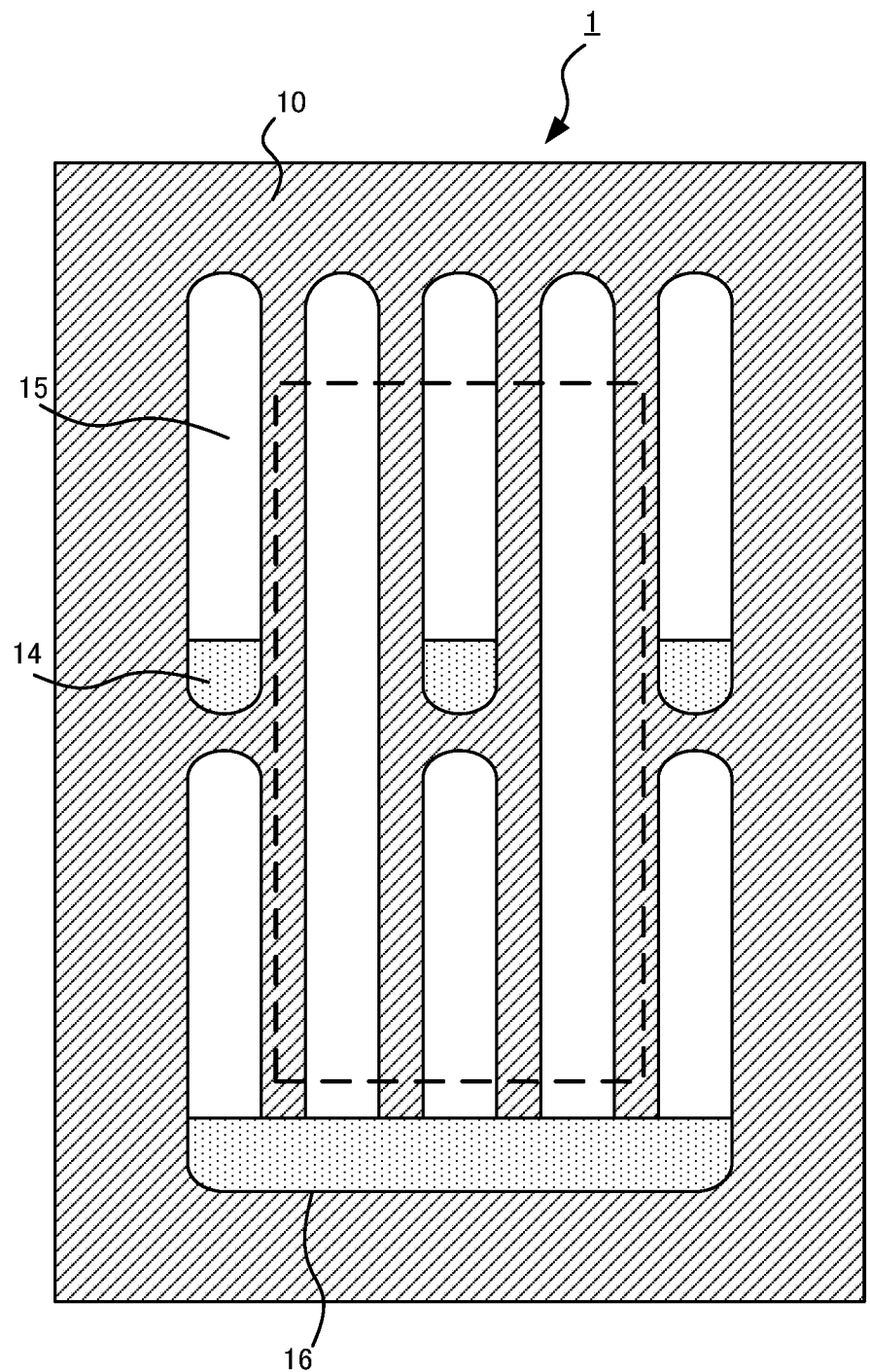
FIG. 9 is a cross-sectional view of a cooling device according to Embodiment 2.

FIG. 9 is a cross-sectional view of a cooling device according to Embodiment 2. The cooling device 1 illustrated in FIG. 9 includes a bypass 16 connecting the vertical directional lower ends of at least some of the grooves 15 among the grooves 15. The use of the bypass 16 causes convection of the refrigerant 14 in the bypass 16, and thus the temperature of the refrigerant 14 is equalized in the horizontal direction. Thus, the temperature of the electronic component 6 attached to a portion of the first main surface 11 facing the bypass 16 is equalized in the horizontal direction.

As described above, according to the vehicle power conversion device 2 of Embodiment 2 of the present disclosure, the cooling performance of the vehicle power conversion device 2 can be improved by joining the heat sinks 20, at intervals, on the second main surface 12 of the base 10 that internally has the grooves 15 with refrigerant 14 enclosed. Additionally, forming in the interior of the base 10 the grooves 15 extending in the vertical direction enables equalization of the temperature of the electronic component 6 in the vertical direction. With fins serving as the heat sinks 20 extending in the same extending direction as the grooves 15, cooling performance of the vehicle power conversion device 2 can be improved. Since the base 10 includes, inside thereof, the grooves 15 extending in the vertical direction, the vehicle power conversion device 2 according to Embodiment 2 is suitable for a cooling method in which variance in temperature occur in the vertical direction, for example, a cooling method utilizing natural convection.

Embodiment 3

Figure 10:
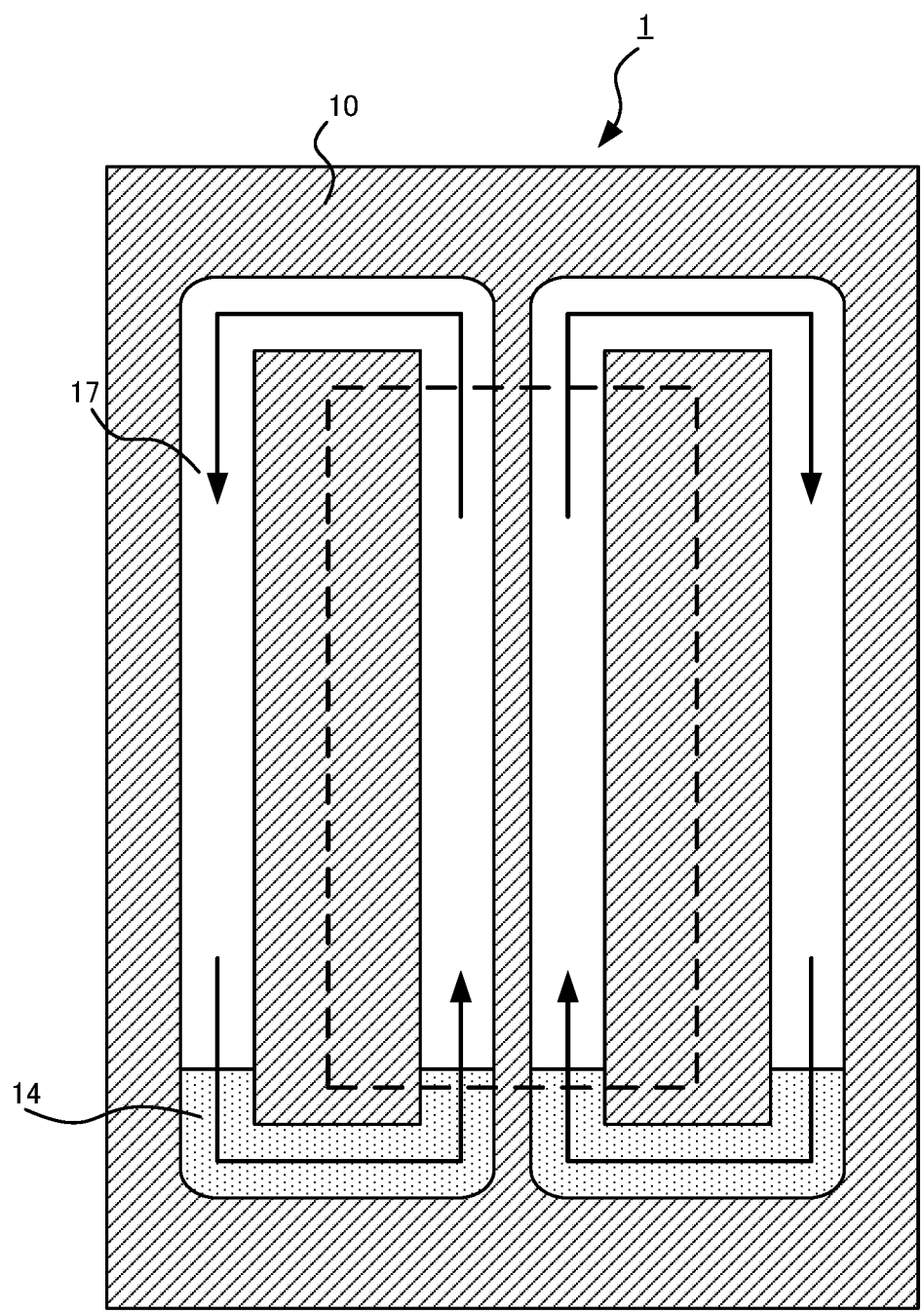
FIG. 10 is a cross-sectional view of a cooling device according to Embodiment 3 of the present disclosure.

FIG. 10 is a cross-sectional view of a cooling device according to Embodiment 3 of the present disclosure. Unlike Embodiment 1, the base 10 of the cooling device 1 according to Embodiment 3 has annular grooves 17 each having a central axis extending in the direction in which the first main surface 11 and the second main surface 12 are opposite to each other. As in Embodiment 1, the heat sinks 20 are joined to the second main surface 12.

As in Embodiment 1, the cooling device 1 cools the electronic component 6. As indicated by the dashed line in FIG. 10, the electronic component 6 is attached to a portion of the first main surface 11 that faces portions of the grooves 17, thereby causing convection of the refrigerant 14 as indicated by the solid arrows in FIG. 10. The convection of the refrigerant 14 causes equalization of the temperature of the electronic component 6 attached to the first main surface 11.

As described above, according to a vehicle power conversion device 2 of Embodiment 3 of the present disclosure, cooling performance of the vehicle power conversion device 2 can be improved by joining the heat sinks 20, at intervals, on the second main surface 12 of the base 10 that internally has the grooves 17 with refrigerant 14 enclosed. Additionally, the base 10 including the annular grooves 17 enables the equalization of the temperature of the electronic component 6.

Embodiment 4

Figure 11:
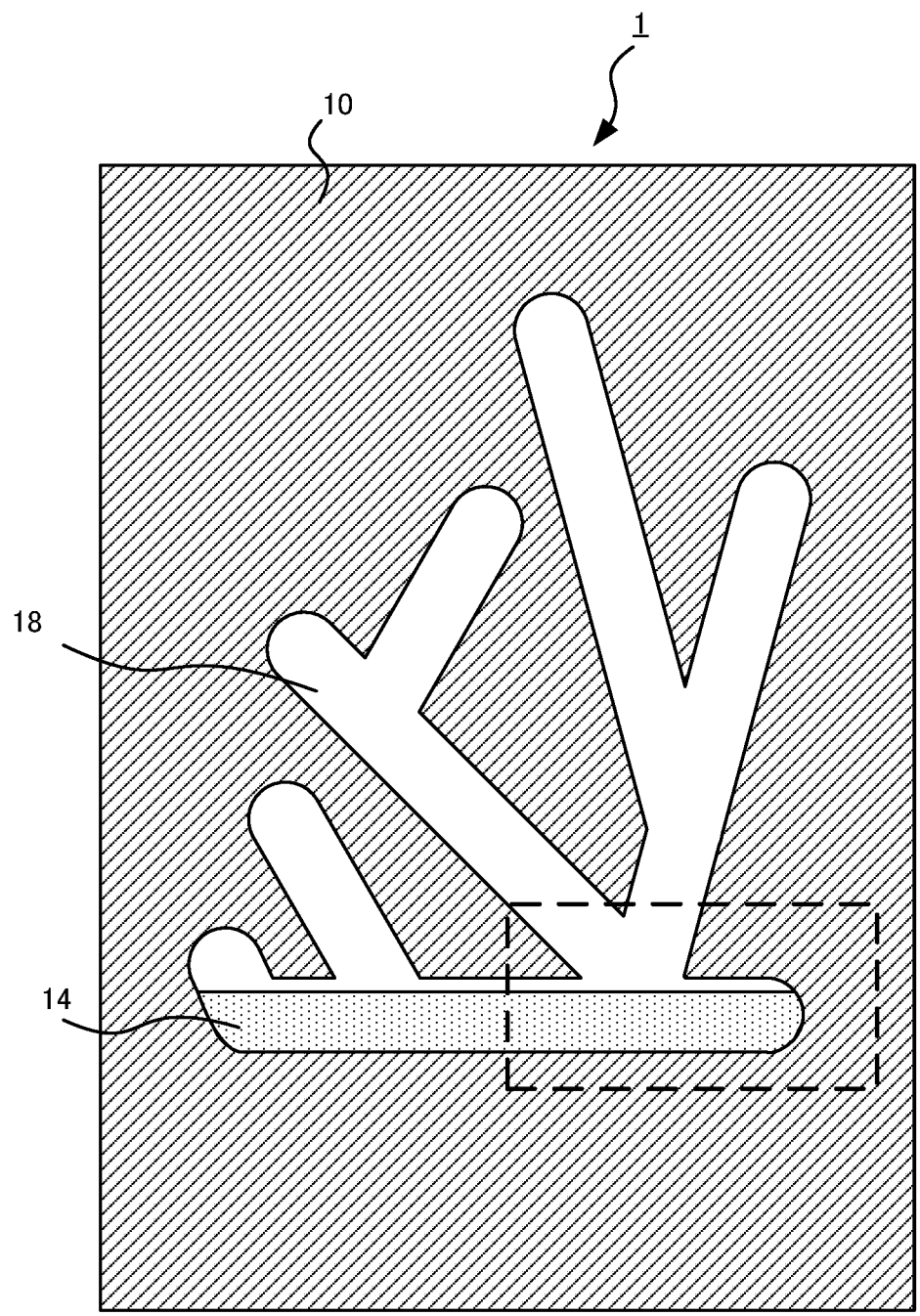
FIG. 11 is a cross-sectional view of a cooling device according to Embodiment 4 of the present disclosure.

FIG. 11 is a cross-sectional view of a cooling device according to Embodiment 4 of the present disclosure. Unlike Embodiment 1, the base 10 of the cooling device 1 according to Embodiment 4 includes a groove 18 having at least one branch.

As indicated by dashed line in FIG. 11, the electronic component 6 is attached to a portion of first main surface 11 that faces a portion of the groove 18, thereby causing convection of the refrigerant 14 in the groove 18 having at least one branch. The convection of refrigerant 14 enables equalization of the temperature of the electronic component 6. The groove 18 having the branch can transfer heat to the whole of heat sinks 20. Thus, cooling performance of a vehicle power conversion device 2 can be improved.

As described above, according to the vehicle power conversion device 2 according to Embodiment 4 of the present disclosure, cooling performance of the vehicle power conversion device 2 can be improved by joining the heat sinks 20, at intervals, on the second main surface 12 of the base 10 that internally has the grooves 18 with the refrigerant 14 enclosed. The base 10 including the groove 18 having at least one branch enables the equalization of the temperature of the electronic component 6. Furthermore, the transfer of heat to whole of the heat sinks 20 can improve cooling performance of the vehicle power conversion device 2.

The present disclosure is not limited to the above Embodiments, and any Embodiment may be combined. The shape of the heat sinks 20 is not limited to fins, and may be any shape such as a pinholder or accordion shape. The cooling device 1 may face any direction when attached to the vehicle power conversion device 2. For example, the cooling device 1 having the first main surface 11 and the second main surface 12 opposite vertically to each other may be attached to the vehicle power conversion device 2 while covering an opening 7 formed vertically on an upper surface of the vehicle power conversion device 2. In the above example, the base 10 covers the opening 7 from the outside of the housing 3. Alternatively, the base 10 may be disposed in the housing 3 covering the opening 7 from the interior of the housing 3 with the heat sinks 20 protruding outside of the housing 3 from the opening 7.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Cooling device
2 Vehicle power conversion device
3 Housing
4 Cover
5 Vent

6 Electronic component
7 Opening
10 Base
11 First main surface
12 Second main surface
13, 15, 17, 18 Groove
14 Refrigerant
16 Bypass
20 Heat sink
100 Vehicle

The invention claimed is:

1. A vehicle power conversion device comprising:
a housing configured to accommodate an electronic component therein and to be fixed to a vehicle and having an opening;
a base that is a plate-shaped member (i) having a first main surface to which the electronic component is attached and a second main surface, the first main surface and the second main surface being opposite to each other in a horizontal direction, (ii) having a plurality of separately sealed grooves therein, the plurality of grooves with refrigerant enclosed extending along the first main surface and the second main surface, (iii) covering the opening by the first main surface facing an interior of the housing, and (iv) being attached to the housing; and
heat sinks joined, at intervals, on the second main surface, wherein
each groove has an annular shape having a central axis that extends in a direction in which the first main surface and the second main surface are opposite to each other,
the grooves are arranged in the horizontal direction, and
the electronic component is attached to a portion of the first main surface that faces a part of one of adjacent grooves and a part of another one of the adjacent grooves.

2. The vehicle power conversion device according to claim 1, wherein a material of the base and the heat sinks is aluminum.

3. The vehicle power conversion device according to claim 2, wherein the heat sinks are brazed onto the second main surface.

4. The vehicle power conversion device according to claim 1, wherein a plurality of fins extend in a traveling direction of the vehicle.

5. The vehicle power conversion device according to claim 1, wherein
each groove extends in a vertical direction.

6. The vehicle power conversion device according to claim 2, wherein
each groove extends in a vertical direction.

7. The vehicle power conversion device according to claim 3, wherein
each groove extends in a vertical direction.

8. The vehicle power conversion device according to claim 5, wherein the heat sinks are fins extending in the vertical direction.

9. The vehicle power conversion device according to claim 5, wherein the base internally includes a bypass connecting together vertical-direction lower ends of at least some of the grooves.

10. The vehicle power conversion device according to claim 1, wherein at least one groove of the plurality of grooves has at least one branch, and
the electronic component is attached to a portion of the first main surface that faces at least part of a vertical-direction lower end of the groove having the at least one branch.

11. The vehicle power conversion device according to claim 2, wherein at least one groove of the plurality of grooves has at least one branch, and
the electronic component is attached to a portion of the first main surface that faces at least part of a vertical-direction lower end of the groove having the at least one branch.

12. The vehicle power conversion device according to claim 3, wherein at least one groove of the plurality of grooves has at least one branch, and
the electronic component is attached to a portion of the first main surface that faces at least part of a vertical-direction lower end of the groove having the at least one branch.

13. The vehicle power conversion device according to claim 1, wherein the electronic component comprises an electronic element made of a wide bandgap semiconductor using silicon carbide, a gallium nitride-based material, or diamond.

* * * * *